Oct. 25, 1966 E. A. CORL ETAL 3,281,825

NON-CONTACTING ENCODER

Filed Jan. 25, 1963

2 Sheets-Sheet 1

INVENTORS
EDWIN A. CORL
GUS SANDERS
BY

Shenier & O'Connor
ATTORNEYS

Oct. 25, 1966 E. A. CORL ET AL 3,281,825

NON-CONTACTING ENCODER

Filed Jan. 25, 1963 2 Sheets-Sheet 2

INVENTORS
EDWIN A. CORL
GUS SANDERS
BY
Shenier & O'Connor
ATTORNEYS

United States Patent Office 3,281,825
Patented Oct. 25, 1966

3,281,825

NON-CONTACTING ENCODER

Edwin A. Corl, Bethel, Conn., and Gus Sanders, St. Albans, N.Y., assignors to United Aircraft Corporation, East Hartford, Conn., a corporation of Delaware Filed Jan. 25, 1963, Ser. No. 253,936
7 Claims. (Cl. 340—347)

Our invention relates to a position encoder and more particularly to a non-contacting position encoder which overcomes the defects of non-contacting encoders of the prior art.

There are known in the prior art devices which translate linear or angular position or motion into an electrical code to permit the function to be processed by computing devices which require inputs in digital form. Most of these devices of the prior art comprise a movable member carrying a coded pattern of elements adapted to be engaged by brushes which carry the encoded output to the external circuit in accordance as the brushes engage elements of the pattern. Owing to the mechanical contact between the brushes and the disc or movable member these encoders have a relatively limited life and they generate undesirable noise in the output of the device. That is, they embody all the disadvantages of any electrical device requiring mechanical contact between relatively movable members.

It has been suggested in the prior art that in order to overcome the disadvantages of the contacting encoders there be provided a disc or movable member formed of a ferromagnetic material on which the code pattern has been inscribed. With this form of movable member sensing devices which do not require mechanical contact with the pattern can be employed. While an encoder of this type overcomes the disadvantages of the contacting encoder it incorporates a number of features which limit its application. First an encoder of this type is an alternating current device which requires a separate high-frequency source of power. High current levels and poor efficiency characterize this type of non-contacting encoder.

In addition to the defects pointed out above, great difficulty has been encountered in attempting to make a pattern for the non-contacting encoder which can have a high resolution in a small space and which is sufficiently accurate to permit the formation of very small patterns. The technique of pressing and molding ferrite materials is not satisfactory since it is nearly impossible to maintain the very small tolerances required for small patterns. This results from shrinkage of the ceramic-like ferrite material upon sintering.

Techniques which employ a ferrite substrate are somewhat better than the molding technique. Still they do not permit of the formation of an extremely small pattern having a high resolution. Attempts to etch into a ferromagnetic substrate to form bits of the required depth result in poor pattern definition owing to the fact that the etchant undercuts the areas covered by the photoresist material.

Where attempts are made to electroplate high permeability material into an etched photoresist pattern, the deposited material mushrooms so as to prevent the formation of an accurate pattern.

We have invented a non-contacting encoder which overcomes the defects of the prior art pointed out hereinabove. Our non-contacting encoder permits the ready formation of a very small and accurate pattern having a high resolution. We are able to produce a small pattern having an accurate bit definition. We have invented an improved sensing device for our non-contacting encoder. Our encoder overcomes all the disadvantages of contacting encoders while permitting the formation of small and accurate patterns. Our encoder does not require use of a separate high-frequency power source for exciting the sensors. Our pattern can be formed at relatively less expense than can patterns of the prior art.

One object of our invention is to provide a non-contacting encoder which overcomes the disadvantages of contacting encoders of the prior art while permitting the formation of a small and accurate pattern.

Another object of our invention is to provide a non-contacting encoder which does not require a separate high-frequency power source for exciting the sensing devices.

A further object of our invention is to provide a non-contacting encoder having a relatively low cost code pattern.

Other and further objects of our invention will appear from the following description.

In general our invention contemplates the provision of a non-contacting encoder in which the coded pattern comprises a plurality of conductive bits carried by a nonconductive substrate. The sensing elements of our encoder each comprises a feedback oscillator having a feedback transformer which produces oscillations at a relatively high level when nonconductive material is disposed adjacent the feedback transformer core. In response to the presence of a conductive bit adjacent the core the flux linkages between the transformer windings are reduced to a point at which the oscillator output is at a relatively low level.

In the accompanying drawings which form part of the instant specification and which are to be read in conjunction therewith and in which like reference numerals are used to indicate like parts in the various views.

Figures 1, 2:
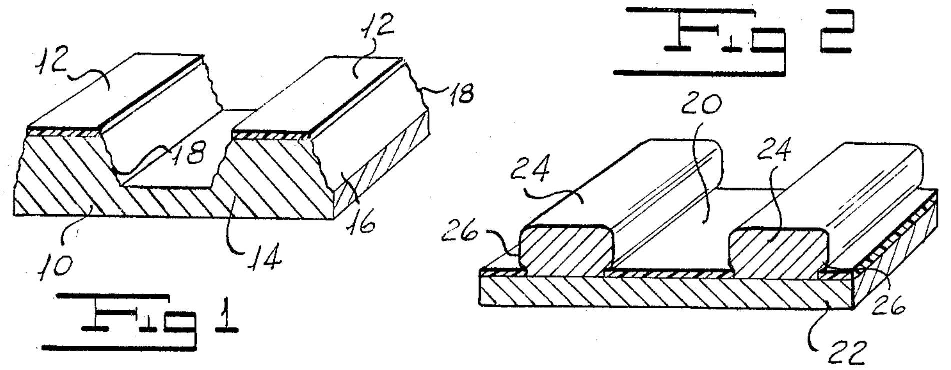
FIGURE 1 is a fragmentary perspective view illustrating the defect of one technique of the prior art for producing a non-contacting encoder pattern.
FIGURE 2 is a fragmentary perspective view illustrating the defect of another technique of the prior art for producing a non-contacting encoder pattern.

Referring now to FIGURE 1 of the drawings in one technique of the prior art for forming a non-contacting encoder pattern a base 10 of a suitable high permeability material such, for example, as a ferrite has a resist pattern 12 applied to the surface thereof. This can be accomplished by the techniques well known in the art. As is known, in applying such a pattern to the base a coating of photosensitive material is applied to the surface of the base 10 and is exposed to light through a negative of the pattern to be etched into the base 10. After exposure of the material the unexposed portion is washed away to leave the resist pattern 12. When this has been done a suitable etchant is applied to the material to etch out grooves 14 between lands 16 disposed under the pattern 12. While this technique is satisfactory for the formation of relatively large patterns it will not produce the required bit definition for small, high resolution patterns. This defect results from the action of the etchant in undercutting the lands 16 at the edges of the grooves 14 in the areas 18 shown in FIGURE 1.

Referring now to FIGURE 2 in another technique which has been attempted in the prior art for the formation of non-contacting encoder patterns, a photoresist pattern 20 is formed on top of a suitable substrate 22 in the manner described above in connection with FIGURE 1. When this has been done, high permeability material is electroplated into the exposed areas of the resist to form lands 24. For the required land thickness it is impossible to maintain the necessary pattern definition since the electroplated material mushrooms out over the resist 20 in the areas 26 so that the edges of the land 24 are not sharply defined. For this reason the electroplating technique has been found to be entirely unsuitable for the formation of very small patterns requiring close tolerances.

Figure 3:
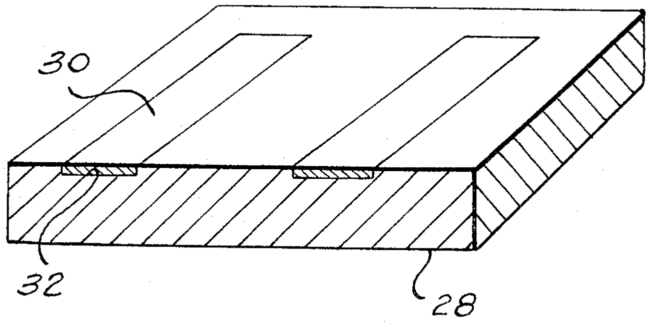
FIGURE 3 is a fragmentary perspective view of a coded pattern of our non-contacting encoder.

Our invention embodies the sensing of conductive patterns without requiring mechanical contact between the sensing means and the elements making up the pattern. Referring now to FIGURE 3 we have shown a fragmentary perspective view of a portion of the code-carrying element of our non-contacting encoder. In this form of the device a substrate 28 carries a plurality of conductive segments 30 which are embedded in recesses 32 formed in the substrate 28. This pattern can be formed by techniques to be described hereinafter. The substrate 28 may be any nonconductive material and it may, if desired, be formed of a high permeability nonconductive material.

Figures 4, 12, 13:
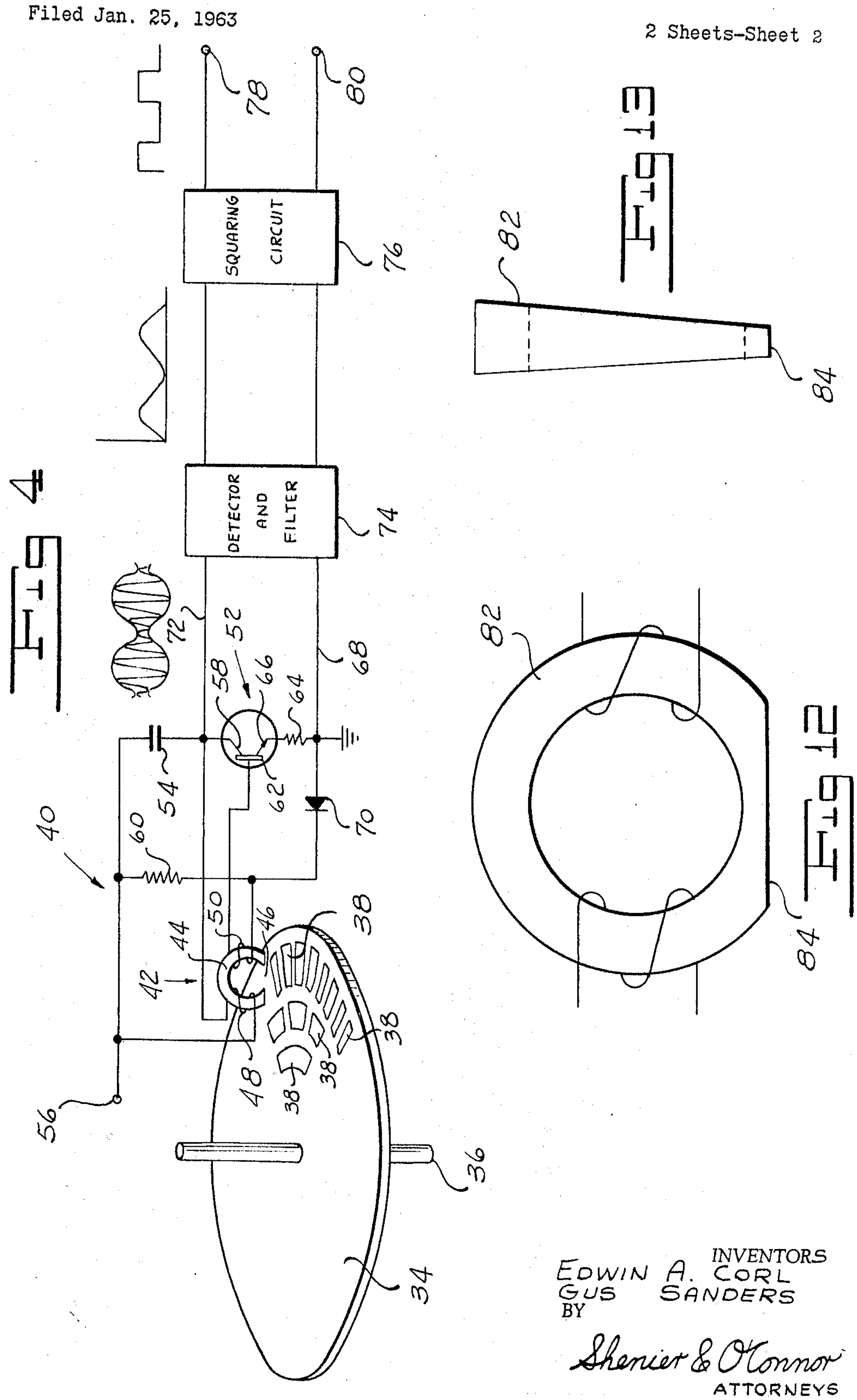
FIGURE 4 is a schematic view illustrating our non-contacting encoder and one of the encoder sensing devices.
FIGURE 12 is an elevation of an alternate form of sensing element which may be employed in our non-contacting encoder.
FIGURE 13 is a side elevation of the form of sensing element shown in FIGURE 12.

Referring now to FIGURE 4 we have shown a form of our encoder in which the code-carrying member is a disc 34 carried by a shaft 36, the position of which is to be encoded. Disc 34 carries a plurality of conductive elements 38 arranged on the loci of circles to provide the required electrical outputs which are representative of the angular position of shaft 36. We have illustrated one of the sensing arrangements indicated generally by the reference character 40 of our device in FIGURE 4. It will readily be understood that as many sensors 40 are employed as are necessary to produce the required outputs from the various circles of conductive segments 30.

The sensing arrangement 40 includes as a sensing element a transformer indicated generally by the reference character 42 having a generally toroidal core 44 provided with an air gap 46 and carrying respective primary and secondary windings 48 and 50. We connect the transformer 42 in a circuit with a transistor indicated generally by the reference character 52 to form an oscillator which normally oscillates at a relatively high output level. We connect the primary winding 48 and a tuning capacitor 54 in parallel between the positive terminal 56 of a suitable source of potential and collector 58 of transistor 52. We connect a biasing resistor 60 and the secondary winding 50 of transformer 42 in series between terminal 56 and the base 62 of transistor 52. A biasing resistor 64 connects the emitter 66 of the transistor 52 to a ground conductor 68. We connect a regulator diode 70 between conductor 68 and the common terminal of resistor 60 and winding 50.

Normally the circuit just described oscillates to provide a relatively high level oscillatory output on the output conductor 72 from collector 58. As is known in the art the required condition for sustained oscillation in a circuit such as that shown in FIGURE 4 is that the product of A and B must have a magnitude of unity and a phase angle of zero degrees at the desired frequency where A is the base to collector voltage gain of transistor 52 and B is the voltage transformation ratio of the transformer 42. Also as is known in the art where a toroidal transformer has its windings separated as shown in FIGURE 4, the leakage flux around the primary and secondary windings 48 and 50 is appreciable. This leakage flux establishes a magnetic field in proximity to the coils. The extent of the leakage flux limits the induced secondary voltage to some value less than the primary voltage depending upon the turns ratio of the windings. That is, the secondary voltage may have a value significantly different from what might be expected base solely on the transformer turns ratio. In any event the voltage ratio is fixed by transformer design so the B is numerically a constant as long as the flux distribution around the transformer is not changed. If we adjust the base-to-collector voltage gain of transistor 52 to satisfy the criteria for oscillation, the circuit 40 will oscillate at a frequency determined by the inductance appearing across the capacitor 54. It will thus be seen that by using the arrangement illustrated in FIGURE 4 we have successfully obviated the need for employing an independent, high-frequency power source for the sensor.

As is known in the art where conductive material is placed in an alternating magnetic field, eddy currents are generated in the material. Thus where conductive material is disposed adjacent the transformer 42 in the region of the air gap 46 there are induced in the material eddy currents which in turn oppose the flux produced by the primary winding excitation. Consequently the voltage transformation ratio of the transformer 42 is affected and the circuit 40 will oscillate at a relatively lower level than that output level which exists in the absence of conductive material adjacent the air gap 46.

From the structure thus far described it will be apparent that with no conductive bit 38 disposed adjacent transformer 42 the circuit 40 operates to produce a relatively high level oscillatory output on conductor 72. Now as shaft 36 moves to position a conductive bit 38 adjacent the air gap 46 circuit 40 switches to a relatively low level output on conductor 72. That is, the output voltage at conductor 72 appears as an amplitude-modulated, oscillating voltage as shaft 36 turns. We have chosen the low level of oscillation to represent a logical "zero" in the output digital representation while the high level output represents a logical "one" in the output digital representation. In order to provide useful voltages from the ouput on conductor 72 we pass this signal through a detector and filter 74 and then through a squaring circuit 76 to produce a generally rectangular wave form across the output terminals 78 and 80 of the sensing device.

From the description given above it will be clear that we have shown a collector-to-base feedback oscillator circuit for exciting the sensing transformer in FIGURE 4. It will readily be appreciated that any other oscillator circuit such, for example, as Colpitts, Hartley, Clapp and other oscillators, could be used. Further, we have illustrated a particular form of transformed 42 in which the core 44 is generally toroidal and formed with an air gap 46. Other specific types of core can readily be employed. For example, as shown in FIGURE 12, we could use a core 82 which is generally wedge-shaped in side elevation with the narrow portion adjacent the disc 34 and formed with a flat surface 84. Alternately we could employ a rectangular core with a thin leg adjacent the disc 34 or with this leg open to form an air gap adjacent the disc. The major factor which should be remembered in connection with the design of the particular transformer is that leakage flux be permitted to pass through the conductive element.

We have further described the form of our encoder in FIGURE 4 without reference to the particular material used to form the substrate carrying conductive elements 38. The material could be any suitable nonconductive material. It may be preferable to employ a high permeability nonconductive material to form the substrate to provide a greater change in flux as the transformer core moves relatively from an area having no conductive material to an area of conductive material.

We have discovered that the use of conductive material to form the elements 30 in the substrate 28 will produce the desired effect with only a very slight thickness of conductive material as compared with the thickness of a ferromagnetic element in the prior art. That is, a thickness of conductive material in the order of mils or tenths of mils produces the same effect as will elements of high permeability material of the prior art in thicknesses of greater than 0.005 inch.

Figures 5, 6, 7, 8, 9, 10, 11:
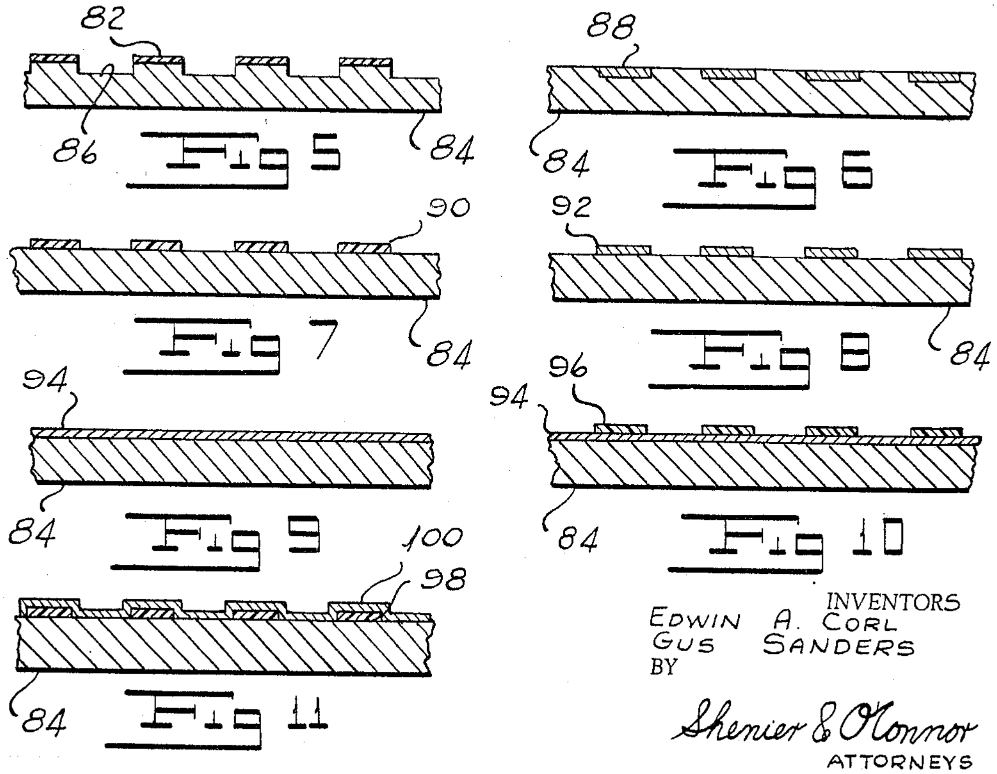
FIGURE 5 is a fragmentary sectional view illustrating one step in one technique of forming the encoder pattern of our non-contacting encoder.
FIGURE 6 is a fragmentary sectional view illustrating another step in a technique of forming the pattern of our non-contacting encoder.
FIGURE 7 is a fragmentary sectional view illustrating a step in another technique of forming the pattern of our non-contacting encoder.
FIGURE 8 is a fragmentary sectional view illustrating a further step in the technique of forming our encoder pattern shown in FIGURE 7.
FIGURE 9 is a fragmentary sectional view illustrating a step in a further method of forming the encoder pattern of our non-contacting encoder.
FIGURE 10 is a fragmentary sectional view illustrating a further step in the technique of forming our encorder pattern shown in FIGURE 8.
FIGURE 11 is a fragmentary sectional view illustrating still another technique of forming the encoder pattern of our non-contacting encoder.

Referring now to FIGURES 5 and 6 there is illustrated one method for producing an encoded element carrying a flush pattern. In this method we apply a layer 82 of resist to a substrate 84 of any suitable nonconductive material which may, for example, be a ferromagnetic alloy containing nickel, iron or cobalt or any of the well known ferrites. After the coating 82 has been applied to the surface of the substrate, it is exposed through a negative of the pattern to be produced and following this exposure the unexposed portions are washed away. Next the surface is subjected to the action of a suitable etchant to form grooves or recesses 86 in the exposed surface of the substrate 84. Next conductive material is deposited in the grooves 86 as by electroplating or the like to form the conductive elements 88. The conductive material may be any suitable nonferromagnetic material such, for example, as copper, silver, gold and the like. When the elements 88 have been formed by electroplating or by vapor-deposition of the metal then the resist 82 is removed and after polishing the pattern appears as shown in FIGURE 6.

It may be desired to provide an embossed or raised pattern of conductive elements on the substrate. In this case, as shown in FIGURE 7, the resist pattern 90 is formed in the manner described above in connection with FIGURE 5 and rather than etching in the areas of the substrate 84 which are exposed, the conductive material is plated or otherwise deposited in the exposed areas to form the elements 92 shown in FIGURE 8 and the resist is removed to leave an embossed or raised pattern.

Another technique which can be used to form a pattern such as that shown in FIGURE 8 is to apply a thin layer 94 of conductive material to a substrate 84 as shown in FIGURE 9. When this has been done the resist pattern 96 can be applied over the layer 94. Then the conductive material 94 in the exposed areas can be etched to form the conductive elements as shown in FIGURE 8. In yet another technique as illustrated in FIGURE 11, the photoresist pattern 98 can be developed on the surface of the substrate 84 and then conductive material 100 is plated over the entire surface. The resist 98 is dissolved and the surface is agitated to develop the pattern of conductive elements 92 shown in FIGURE 8.

It is to be understood that while we have disclosed our invention in connection with the pattern of a brushless encoder, it is equally applicable to other systems. For example, conductive ink could be be printed onto a nonconductive base such as a card to permit the card to be read by our sensing arrangement. Similarly, perforated tape formed of plastic or the like plated with a nonferromagnetic conductive material could be passed over a block of nonconductive material which might be a high magnetic permeability material to cause the sensing device to change from a high output level when a hole in the tape is sensed to a low output level when areas of the tape between the holes were adjacent the sensor.

In use of our non-contacting encoder we form the required pattern of conductive elements 32 in a substrate 28 of nonconductive material which may, if desired, be high permeability material. We next arrange the sensing devices 40 so that with the air gap 46 adjacent an area of nonconductive material the circuit oscillates to produce a relatively high level output on conductor 72. Now when shaft 36 moves to a position at which a conductive element 38 is adjacent the air gap 46, eddy currents are induced therein by the leakage flux from the transformer 42. These eddy currents in turn produce a counter-flux which reduces the coupling between windings 48 and 50 to cause the output at conductor 72 to fall to a relatively low level. We pass this output on conductor 72 through a detector and filter circuit 74 and through a squaring circuit 76 to produce an output which in one form of encoder alternately represents a "one" and a "zero" in the binary code. This output is then available as the desired input to a computing device. As has been pointed out hereinabove we employ as many sensing arrangements 40 as are necessary to give the required outputs from the encoder.

It will be seen that we have accomplished the objects of our invention. We have provided a non-contacting encoder which overcomes the disadvantages of contacting encoders of the prior art while permitting the formation of a small and accurate pattern. Our encoder overcomes the disadvantages of non-contacting encoders of the prior art. It permits the formation of a small, high-resolution encoded pattern. Our encoder does not require a separate high-frequency power source for exciting the sensing device. Our encoder permits the formation of a relatively inexpensive small and accurate coded pattern.

It will be understood that certain features and subcombinations are of utility and may be employed without reference to other features and subcombinations. This is contemplated by and is within the scope of our claims. It is further obvious that various changes may be made in details within the scope of our claims without departing from the spirit of our invention. It is, therefore, to be understood that our invention is not to be limited to the specific details shown and described.

Having thus described our invention, what we claim is:

1. An encoder including in combination sensing means comprising a core and respective input and output windings carried by said core at different physical locations thereon, said core providing a flux path for linking said windings, and means for energizing said input winding with alternating current to produce a flux in said path to cause said sensing means to produce an output of a certain amplitude, a member comprising elements alternately of conductive material and of nonconductive material, and means mounting said member for movement of said elements into and out of said flux path whereby the presence of a conductive element reduces the coupling between said windings to reduce said sensing means output amplitude.

2. An encoder as in claim 1 in which said core is formed with an air gap adjacent said member.

3. An encoder as in claim 1 in which said core is formed with a portion of reduced cross-sectional area adjacent said member.

4. An encoder including in combination sensing means comprising a core and an exciting winding carried by said core and means for applying an alternating current to said winding normally to cause said sensing means to provide an output of a certain amplitude, a member comprising elements alternately of conductive nonmagnetic material and of nonconductive magnetic material and means mounting said member for movement adjacent said core to increase said output amplitude in response to the presence of a nonconductive magnetic element adjacent said core and to reduce said output amplitude in response to the presence of a conductive nonmagnetic element adjacent said core.

5. In an encoder a coding disc comprising a body of nonconductive magnetic material and a coded pattern of elements of conductive nonmagnetic material carried by said body and separated by said nonconductive magnetic material.

6. An encoder including in combination sensing means comprising a core and respective input and output windings carried by said core at different physical locations, said core providing a flux path for linking said windings and means for energizing said input winding with alternating current normally to cause said sensing means to produce an output of a certain amplitude, an encoder disc comprising a body of nonconductive magnetic material and a coded pattern of elements of conductive nonmagnetic material on said body separated by said nonconductive magnetic material, and means mounting said disc for movement of said elements into and out of said flux path to cause the presence of a nonconductive magnetic element to increase said sensing means output amplitude and to cause the presence of a conductive nonmagnetic element to reduce said output amplitude.

7. A transducer including in combination sensing means comprising an oscillator circuit comprising a feedback transformer having a core provided with input and output windings at different physical locations thereon, said core providing a flux path for linking said windings, said circuit normally producing an output of a certain amplitude, a conductive eddy-current element and means mounting said element for movement from a position out of said flux path to a position in said flux path to reduce said output amplitude.

References Cited by the Examiner

UNITED STATES PATENTS

| | | | |
|---|---|---|---|
| 2,875,429 | 2/1959 | Quade | 179—100.2 |
| 2,928,078 | 3/1960 | Hagopian | 179—100.2 |
| 3,051,943 | 8/1962 | Simon et al. | 340—347 |
| 3,113,300 | 12/1963 | Sullivan | 340—347 |

OTHER REFERENCES

Computers: Key to Total Systems Control,1961, Proceedings of the Eastern Joint Computer Conference, pp. 194–208 relied on (copy available in Scientific Library) 340–173.

IBM Technical Disclosure Bulletin: vol. 4, No. 8, January 1962, pp. 60–61 relied on (copy in Scientific Library) (e40–174.1H).

MAYNARD R. WILBUR, *Primary Examiner.*

DARYL W. COOK, MALCOLM A. MORRISON, *Examiners.*

K. R. STEVENS, *Assistant Examiner.*